(12) United States Patent
Grunwald et al.

(10) Patent No.: US 7,619,160 B2
(45) Date of Patent: Nov. 17, 2009

(54) ENCLOSURE FOR HOUSING COMMUNICATIONS EQUIPMENT

(75) Inventors: Brad N. Grunwald, Euless, TX (US); John A. Keenum, Haltom City, TX (US)

(73) Assignee: Corning Cable Systems LLC, Hickory, NC (US)

( * ) Notice: Subject to any disclaimer, the term of this patent is extended or adjusted under 35 U.S.C. 154(b) by 407 days.

(21) Appl. No.: 11/439,088

(22) Filed: May 23, 2006

(65) Prior Publication Data
US 2007/0272440 A1 Nov. 29, 2007

(51) Int. Cl.
*H02G 3/08* (2006.01)
(52) U.S. Cl. .............. 174/50; 174/58; 174/51; 361/356; 379/399
(58) Field of Classification Search .......... 174/50, 174/58, 51, 60, 64; 379/399, 412, 19, 327; 361/356, 333, 334, 119, 825; 439/188, 676, 439/133.95, 92, 95–98; 220/4.02; 248/906
See application file for complete search history.

(56) References Cited

U.S. PATENT DOCUMENTS

| | | | |
|---|---|---|---|
| 4,742,541 A | 5/1988 | Cwirzen et al. | 379/412 |
| 4,850,014 A * | 7/1989 | Gillis et al. | 379/413.02 |
| 4,882,647 A * | 11/1989 | Collins | 361/119 |
| 4,917,615 A * | 4/1990 | Franks, Jr. | 439/98 |
| 6,535,579 B1 | 3/2003 | Blake et al. | 379/22.06 |
| 6,652,295 B1 | 11/2003 | Glass et al. | 439/94 |
| 6,795,552 B1 | 9/2004 | Stanush et al. | 379/413.01 |
| 6,815,612 B2 | 11/2004 | Bloodworth et al. | 174/50 |

FOREIGN PATENT DOCUMENTS

WO  WO 2006/076120 A1  7/2006

OTHER PUBLICATIONS

Patent Cooperation Treaty, Annex to the Invitation to Pay Additional Fees, Communication Relating to the Results of the Partial International Search, International Application No. PCT/US07/012281, 4 pages.

(Continued)

*Primary Examiner*—Dhiru R Patel
(74) *Attorney, Agent, or Firm*—John H. Vynalck

(57) ABSTRACT

An enclosure for housing communications equipment at a subscriber premises includes at least one cable port for receiving a service provider cable, a subscriber cable, and a ground cable. The enclosure further includes a housing having a base and an outer cover movably attached to the base between an opened position and a closed position so as to define a housing interior volume when the outer cover is in the closed position. A grounding post extends from the base within the housing interior volume and is electrically connectable with the ground cable. Active electronic components located in the housing interior volume connect the service provider cable with the subscriber cable. A service provider security nut attachable to the grounding post both fixes the active electronic components within the housing and grounds the active electronic components to the grounding post and the ground cable. The active electronic components may be mounted to a movable inner cover and the outer cover may include a skirt extending in a first direction to obscure the cable ports, mounting feet, and hinges.

21 Claims, 4 Drawing Sheets

OTHER PUBLICATIONS

Siecor Recommended Procedure, SRP-205-209, Issue 2, "ML 500 Series Network Interface Device Description and Installation Instructions," Jul. 1998, 4 pages.

Siecor Recommended Procedure, SRP-00-509-09, Issue 3, "MLX-2000 Series Network Interface Device Description and Installation Instruction," Nov. 1998, 4 pages.

Corning Cable Systems, SRP-205-255, Issue 7, "Pedestal Network Interface Device (NID) Installation Instructions," Dec. 2001, 6 pages.

US West Communications, Inc, REGN 629-200-900RG, Issue 2, "651 and 652 Building Entrance Protector," Jul. 1995, 15 pages.

Corning Cable Systems, SRP-206-256, Issue 4, "LB200 Bet Enclosure Network Interface Device," Jan. 2003, 4 pages.

* cited by examiner

ENCLOSURE FOR HOUSING COMMUNICATIONS EQUIPMENT

FIELD OF THE INVENTION

The present invention relates generally to enclosures for housing communications equipment. More particularly, the present invention relates to a communications equipment enclosure including a grounding post for fixing active electronic components in the enclosure and for grounding the active electronic components to a ground cable.

BACKGROUND OF THE INVENTION

Enclosures for housing communications equipment are installed at subscriber premises to protect the connections between service provider cables and subscriber cables. One such enclosure is commonly known as a Network Interface Device ("NID"). A NID enclosure generally has electrical connectors and protection devices located in a housing that mounts to the subscriber premises. The NID connects signal transmission cables from the subscriber premises to signal transmission cables from a communications service provider, e.g. from a telephone company or cable company. The NID may also house electronic components used in connecting or dividing signals between the cables.

Typically, the housing has an outer door openable to expose an interior volume that is divided into two sections, a service provider portion (or service provider "compartment") and a subscriber portion (or subscriber "compartment"). Often, the service provider portion is located beneath an inner door, cover, shield, or the like, while the subscriber portion is exposed simply by opening the outer door. Access to the service provider portion may require use of a specialized tool, for example to remove a fastener, such as a security nut. Thus, the subscriber can open the outer door of the housing, thereby exposing the subscriber portion of the housing to access any subscriber equipment, cabling or wiring therein. The subscriber can not, however, access the service provider portion due to the necessity of using the specialized tool to remove the security nut. Some enclosures also allow subscribers to utilize a security feature, such as a lock, that can be by-passed by the service provider. Thus, the subscriber can prevent third parties from accessing the subscriber portion of the housing, while still allowing the service provider access to both the subscriber portion and the service provider portion of the housing.

The service provider cable enters the housing through a cable port leading from the outside of the housing into the service provider portion. The service provider portion generally contains excess voltage and/or current protection devices to protect the electrical equipment from over voltages and over currents. For example, the protection devices may include fuses and/or grounding connections and wires. Electrical components and fiber optic management and routing devices, such as fan out kits, etc. belonging to the service provider may also be mounted in the service provider portion.

Similarly, the subscriber cable enters the housing through a cable port leading from the outside of the housing into the subscriber portion. The subscriber cable may include twisted wire pair cables (POTS or data), coaxial cables (television or data), and even fiber optic cables. Various terminations may be provided in the subscriber portion to allow the NID to be used with different subscriber communications equipment. A subscriber bridge, also referred to as a line module, may be used and is at least partially located within the subscriber portion so as to be accessible by the subscriber. Such a subscriber bridge has one or more subscriber line terminal blocks connected with the subscriber cable. The subscriber bridge may also have a telephone jack providing a demarcation between the subscriber line and the service provider line for directly accessing the service provider line.

In many conventional installations, the service provider cable and the subscriber cable comprise twisted wire pairs. Because some NIDs have provisions for accommodating service provider coaxial cables and/or fiber optic cables, active electronic components have been developed that can receive several signals on such service provider cables and separate the signals into a variety of subscriber outputs, such as voice, internet, and video (e.g., television). These active electronic components are typically mounted on a printed circuit board (PCB), which in the past has been mounted behind the enclosure. In such NIDs, the entire housing has to be removed from the building to gain access to the PCB. As a result, installing and servicing the active electronic components is time consuming. Other designs have been successfully deployed wherein the active electronic components are mounted in the service provider portion of the housing, either attached to the base of the housing, or attached to the internal cover that separates the service provider portion from the subscriber portion.

NIDs may be grounded via a ground line that directs excess voltage, for example in case of lightning strike, away from the housing to protect the electrical equipment and devices connected to the service provider and subscriber cables. Therefore, various cables and components within the NID may be individually attached to a common (earth) ground line as needed. The earth ground line may be attached to a grounding post within the NID. A ground lug may be provided on the PCB and grounding post for making the connections, for example via a short jumper wire or other conductor connecting the PCB to the grounding post and ground line. If the PCB is mounted on or within an inner cover separating the service provider portion and the subscriber portion, the PCB ground connection may need to be disconnected each time the inner cover is to be opened, even if the PCB itself is not being serviced. Further, upon closing of the NID, the technician must remember to connect, or reconnect as the case may be, the ground to the PCB via the jumper wire or conductor, before securing the inner cover. As the contents of the NID become more complex, the number of grounding connections needed are accordingly increased, adding cost and complexity to the device, and adding additional steps to installation or servicing the NID. Therefore, further improvement is desirable in providing a grounded enclosure that is reliable and/or simplifies the conventional grounding structures or procedures.

NIDs are generally mounted via mounting feet to a vertical wall, often by screws extending through the mounting feet. One or more cable ports typically extend from a side of the NID housing, usually the bottom, to allow the various service provider and subscriber cables to enter the housing. As stated above, the service provider usually intends that only certain portions of the housing be accessible to the subscriber. For obvious reasons, service providers want to discourage subscribers from attempting to disturb the service provider portion of the housing, for example, by trying to force open an access door to the service provider compartment, by disconnecting mounting screws, or by trying to manipulate cabling by pulling on the cables entering the housing through the cable ports. Accordingly, service providers have fashioned NIDs with specialized security features, such as security nuts, outer covers, selectable locking, and clear labeling to alert the subscriber as to how and where to open the housing to obtain access to the subscriber portion. However, still further improvement could be achieved in preventing unauthorized or unintended access to the service provider portion, while also providing an aesthetically pleasing NID housing design.

SUMMARY OF THE INVENTION

According to certain aspects of the invention, an enclosure is provided for housing communications equipment at a subscriber premises, the enclosure receiving at least one service provider cable, at least one subscriber cable, and at least one ground cable. The enclosure includes a housing having a base and an outer cover movably attached to the base, the outer cover being movable between an opened position and a closed position, the outer cover and the base defining an interior volume when the outer cover is in the closed position. The base defines at least one cable port for receiving the service provider cable, the subscriber cable, and the ground cable, and preferably defines a service provider cable port, a subscriber cable port and a ground cable port. A grounding post extends from the base within the housing interior volume, the ground cable being electrically connectable with the grounding post. Active electronic components are located in the housing interior volume, the active electronic components connecting the service provider cable with the subscriber cable. A service provider security nut is attachable to the grounding post, thereby both fixing the active electronic components within the housing and grounding the active electronic components to the grounding post and the ground cable. Various options and modifications are possible.

For example, the enclosure may further include an inner cover attachable to the base via a hinge and movable between an opened position and a closed position, the active electronic components being mounted to the inner cover. If so, the service provider security nut may secure the inner cover in the closed position when fixing and grounding the active electronic components. Service provider equipment and subscriber connection (termination) equipment may be located within the housing interior volume, so that when the outer cover is in the opened position and the inner cover is in the closed position with the service provider security nut attached to the grounding post, access to the service provider equipment is prevented, while access to the subscriber connection equipment is permitted. When the outer cover and the inner cover are both in the opened position, access to both the service provider equipment and the subscriber connection equipment is permitted.

Subscriber connection equipment may include at least one of a twisted wire pair termination, a coaxial termination, and a fiber optic termination. The service provider cable may include at least one of a twisted wire pair cable, a coaxial cable, a composite cable, and a fiber optic cable, and the subscriber cable may include at least one of a twisted wire pair cable, a coaxial cable, and a fiber optic cable.

The active electronic components may include a printed circuit board. If so, the grounding post may extend through and electrically contact the printed circuit board when the active electronic components are fixed and grounded. A grounding lug may be attached to the grounding post, the ground cable being attachable to the grounding lug. Alternatively, the ground line may be directly connected to the ground post by hooking the ground line around the ground post and securing the ground line, for example with a washer and nut. The active electronic components may be powered via the service provider cable.

The base may include a back wall and a perimeter wall extending outwardly from the back wall, the perimeter wall may further include an end wall in which the at least one cable port is defined extending therefrom in a first direction, the outer cover having a skirt defining a substantially continuous edge, the skirt extending in the first direction beyond the end wall at least as far as the at least one cable port when the outer cover is in the closed position. Also, the base may include a mounting foot adjacent the end wall for mounting the enclosure to a surface at the subscriber premises, the skirt extending in the first direction at least as far as the mounting foot when the outer cover is in the closed position.

According to certain other aspects of the invention, an enclosure is provided for housing communications equipment at a subscriber premises, the enclosure receiving at least one service provider cable, at least one subscriber cable, and at least one ground cable. The enclosure includes a housing having a base and an outer cover movably attached to the base, the outer cover being movable between an opened position and a closed position, the outer cover and the base defining a housing interior volume when the outer cover is in the closed position. The housing has an inner cover movably attached to the base, the inner cover being movable between an opened position and a closed position, the inner cover and the base defining a service provider compartment within the housing interior volume when the inner cover is in the closed position. The base defines at least one cable port for receiving the service provider cable, the subscriber cable, and the ground cable. Preferably, the base defines a service provider cable port, a subscriber cable port, and a ground cable port. A grounding post extends from the base within the service provider compartment, the ground cable being electrically connectable with the grounding post. The enclosure further includes active electronic components mounted to the housing inner cover within the service provider compartment. The active electronic components connect the service provider cable with the subscriber cable. A service provider security nut is attachable to the grounding post, thereby both fixing the inner cover in the closed position to secure the service provider compartment and grounding the active electronic components to the grounding post and ground cable. Again, various options and modifications are possible.

According to still other aspects of the invention, an enclosure is provided for housing and protecting communications equipment at a subscriber premises, the enclosure receiving at least one service provider cable and at least one subscriber cable. The enclosure includes a housing having a base, the base having a back wall and a perimeter wall extending outwardly from the back wall, the perimeter wall including an end wall defining a plurality of cable ports extending therefrom in a first direction. An outer cover is movably attached to the base, the outer cover being movable between a closed position and an opened position, the outer cover and the base defining a housing interior volume when the outer cover is in the closed position such that connections between the service provider cable and the subscriber cable are made within the housing interior volume. The outer cover has a skirt defining a substantially continuous edge, the skirt extending in the first direction beyond the end wall at least as far as the cable ports when the outer cover is in the closed position. As above, various options and modifications are possible.

If desired, the outer cover may be attached to the housing via a hinge, the hinge being disposed behind the outer cover when the outer cover is in the closed position. Also, the base may include a mounting foot disposed adjacent the end wall, the skirt extending beyond the mounting foot when the outer cover is in the closed position.

It is to be understood that both the foregoing general description and the following detailed description present exemplary embodiments of the invention, and are intended to provide an overview or framework for understanding the nature and character of the invention as it is claimed. The accompanying drawings are included to provide a further understanding of the invention, and are incorporated in and constitute a part of this specification. The drawings illustrate the various exemplary embodiments of the invention, and together with the description serve to explain the principals and operations of the invention.

DETAILED DESCRIPTION OF PREFERRED EMBODIMENTS OF THE INVENTION

Figure 1:
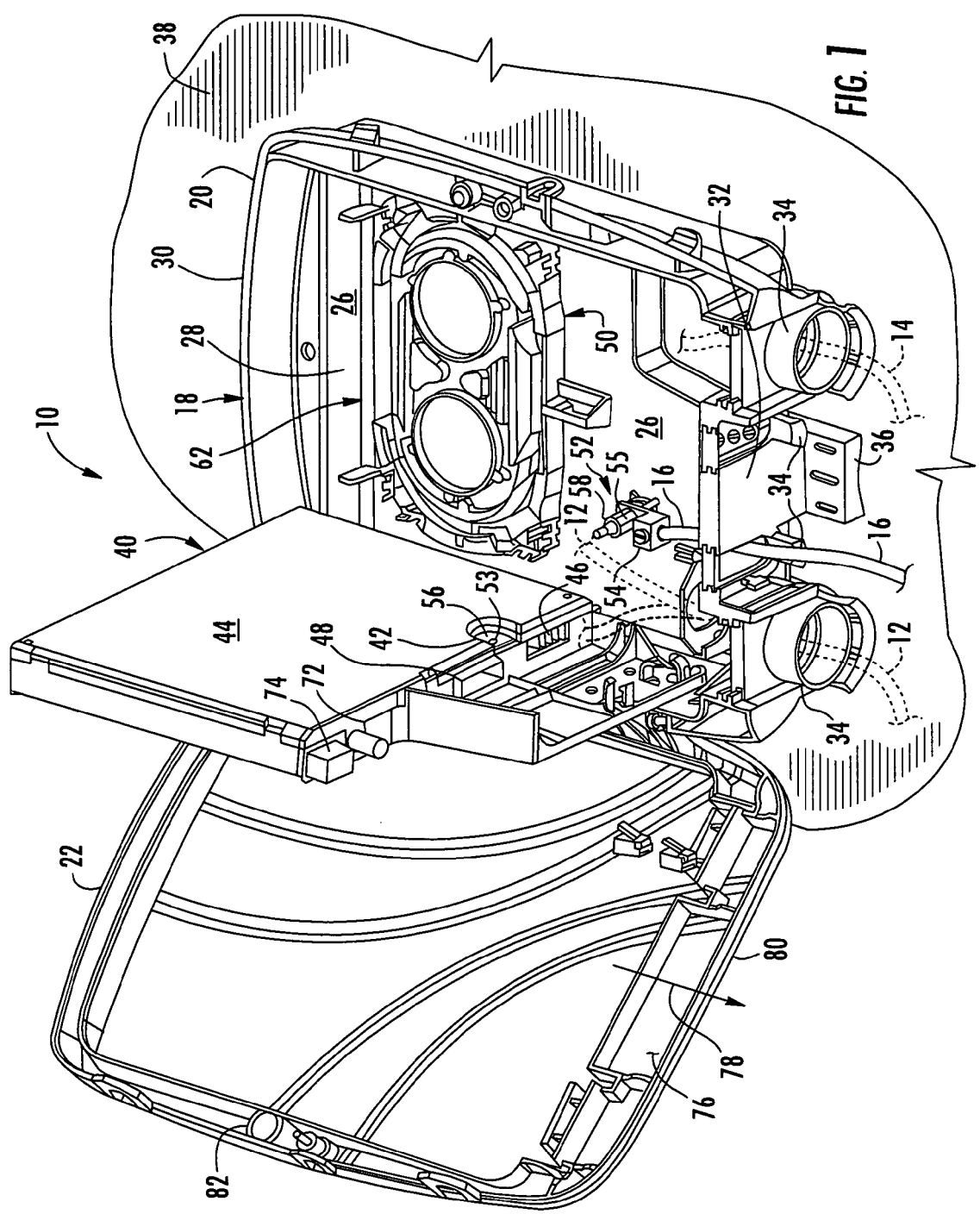
FIG. 1 is a perspective view of one embodiment of an enclosure for housing communications equipment according to the present invention, showing an outer cover in an opened position and an inner cover in an opened position.

Reference will now be made in detail to the presently preferred embodiments of the invention, examples of which are illustrated in the accompanying drawings. Whenever possible, the same reference numerals will be used throughout the drawings to refer to the same or like parts. Thus, it should be understood that the enclosures shown and described herein are merely examples, each incorporating certain benefits of the present invention. Various modifications and alterations may be made to the following examples within the scope of the present invention, and aspects of the different examples may be modified and/or combined in different ways to achieve yet further examples. Accordingly, the intended scope of the invention is to be realized and understood from the entirety of the present disclosure, in view of, but not limited by the following examples.

As broadly embodied in FIGS. 1-4, an enclosure 10 is provided for housing communications equipment at a subscriber premises. The enclosure may be of the type commonly known as a Network Interface Device (NID), but could also comprise other types of enclosures, for example a Multi Dwelling Unit (MDU) enclosure, an Optical Network Terminal (ONT) enclosure, a Building Entrance Terminal (BET) enclosure or other subscriber termination housing. Therefore, it should be clear that the present invention is not limited to use of the enclosure as a NID.

Enclosure 10 receives at least one service provider cable 12, at least one subscriber cable 14, and at least one ground cable 16. It should further be understood that the present invention has utility with various types of cables and the resulting connections between the communications network belong to the service provider and the communications equipment belonging to the subscriber. Therefore, the present invention is not limited to any particular type or types of cables. Accordingly, as discussed below, service provider cable 12 may be a twisted wire pair cable, a coaxial cable, a composite (twisted wire pair and coaxial) cable, or a fiber optic cable. Also, service provider cable 12 could comprise more than one of the above types of cables, depending on the subscriber equipment, the type of installation, and the services available from the service provider or providers. Similarly, subscriber cable 14 may be a twisted wire pair cable, a coaxial cable, a composite cable or a fiber optic cable. In many subscriber premises, multiple subscriber cables 14 could be employed for the desired connections, such as multiple telephone lines, data lines, video (e.g., cable television) lines, etc. One or more ground cables 16 may also be employed, if desired, connected to earth ground or to other grounding structure. Enclosure 10 and its various terminations (described below) may also be configured so as to be used with pre-connectorized cables, and in particular, one or more pre-connectorized fiber optic cables. Enclosure 10 may therefore be used with any possible combination of cables, and the present invention should not be limited by the specific examples depicted herein.

Figure 2:
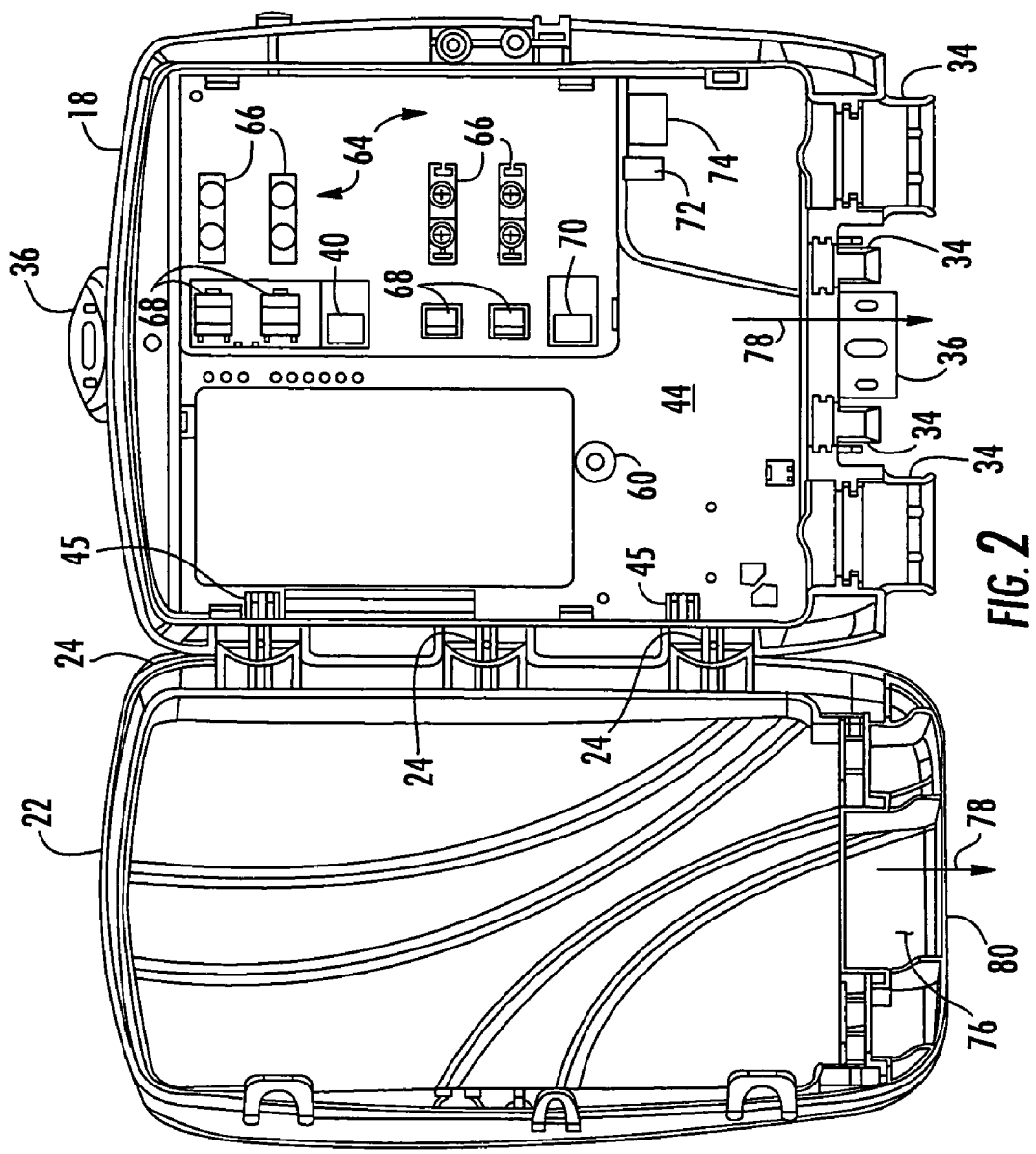
FIG. 2 is a front view of the enclosure of FIG. 1, showing the outer cover in the opened position and the inner cover in a closed position.
Figure 4:
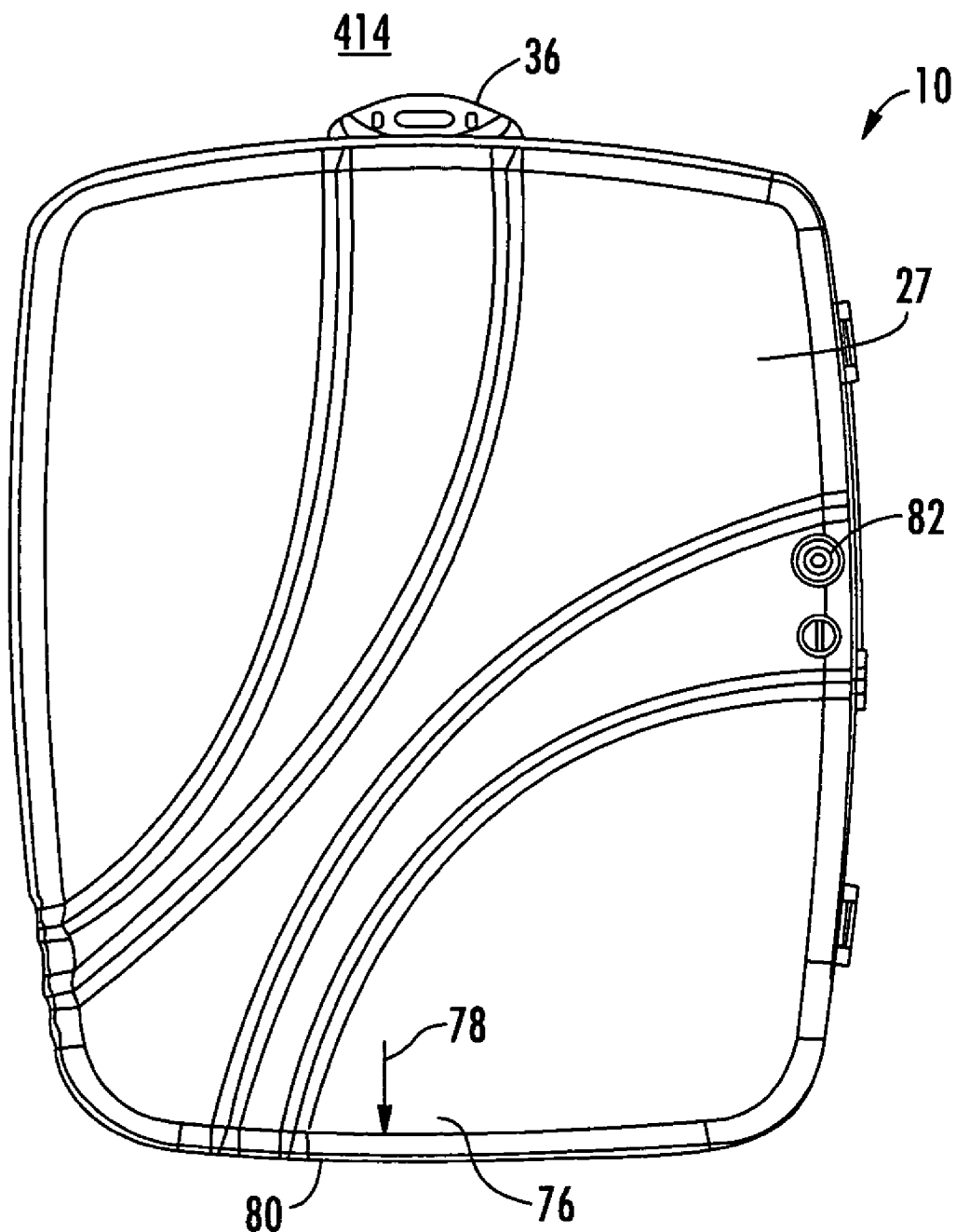
FIG. 4 is a front elevation view of the enclosure of FIG. 1, showing the outer cover in the closed position.

Enclosure 10 includes a housing 18 having a base 20 and an outer cover 22 movably attached to the base. As depicted in FIG. 1 and FIG. 2, outer cover 22 is configured as a door with hinges 24 on the left side (as shown) of outer cover 22 and base 20. It should be understood that use of a plurality of hinges 24, and the location of the hinges on the left side, are both optional. For example, hinges 24 could be located along any other side if desired. Furthermore, other structure could be added or substituted, such as slides, snaps, screws, etc. for attaching outer cover 22 to base 20. Outer cover 22 is movable between an opened position (as shown in FIG. 1) and a closed position (as shown in FIG. 4). Outer cover 22 and base 20 define a housing interior volume 26 when the outer cover is in the closed position.

Base 20 includes a back wall 28 and a perimeter wall 30 extending outwardly from the back wall. Perimeter wall 30 includes an end wall 32 which defines at least one cable port 34 therethrough. As shown, four cable ports 34 are provided, one each for the service provider cable(s) 12, the subscriber cable(s) 14, the ground cable(s) 16, and additional wiring, as required. Providing four ports 34 allows for flexibility in installations, and allows for use of additional wiring entry points for particular applications as desired. It should be understood that any suitable number of ports 34 may be employed depending on the application. Ports 34 may have grommet, gels, etc. (not shown) for sealing the ports once the cables are installed. It should be understood a portion of ports 34 may be formed within outer cover 22. One or more mounting feet 36 may also be provided on base 20 for mounting the enclosure 10 to a stable surface at the subscriber premises, such as a wall 38.

As shown in FIG. 1, active electronic components 40 are removably mounted in the housing interior volume 26. As illustrated, active electronic components 40 include a printed circuit board (PCB) 42, which may be connected via a component housing 44 to enclosure 10. Component housing 44 may function as an inner cover, as will be described below. As illustrated herein, housing/inner cover 44 is connected to enclosure 10 via hinges 45 connected to base 20. As above, other connecting structures and connection locations could be employed for housing/inner cover 44. Also, it would be possible to connect the housing/inner cover 44 to outer cover 22 via hinges or otherwise.

Active electronic components 40 are typically owned by the service provider and provide some of the connection path between service provider cable 12 and subscriber cable 14. Active electronic components 40 could function to process and split multiple signals from service provider cable 12 into component parts (e.g., voice, data, and video) to be transmitted along different subscriber cables 14. Numerous variations are possible for the active electronic components 40, and no limitation on such components should be implied by the illustrations herein.

Active electronic components 40 are typically powered via service provider cable 12, although separate or alternative power sources are possible. Active electronic components 40 preferably have a termination 46 for a power line, as well as at least one termination 48 for the service provider cable 12. As shown, enclosure 10 is suitable for receiving a fiber optic drop cable from the service provider. In such situation, termination 48 can receive a connector mounted upon a pigtail from a splice kit (not shown) disposed in splice tray 50. Of course, if other types of service provider cables 12 are used, termination 48 may be altered or supplemented accordingly.

As shown in FIG. 1, a grounding post 52 extends upwardly from base 22 within the housing interior volume 26. Ground cable 16 is electrically connectable with grounding post 52. As shown, one or more ground lugs 54 may be attached to grounding post 52 via a threaded nut 55 to connect ground cable 16 and/or other elements to the grounding post 52. An aperture 53 is provided though active electronic components 40 and located for receiving grounding post 52. If desired, ground cable 16 may be attached to grounding post 52 in other ways, such as by "j-hooking" the ground cable 16 to the grounding post 52 and/or directly securing the ground cable, for example with nut 55. Use of the laterally extending ground lug 54 retained by nut 55 allows for a reduction in height along grounding post 52 and allows for a clear connection path between PCB 42 and the grounding post. However, other configurations are possible, depending on the configuration of PCB 42, housing/inner cover 44, ground cable 16 and grounding post 52.

Figure 3:
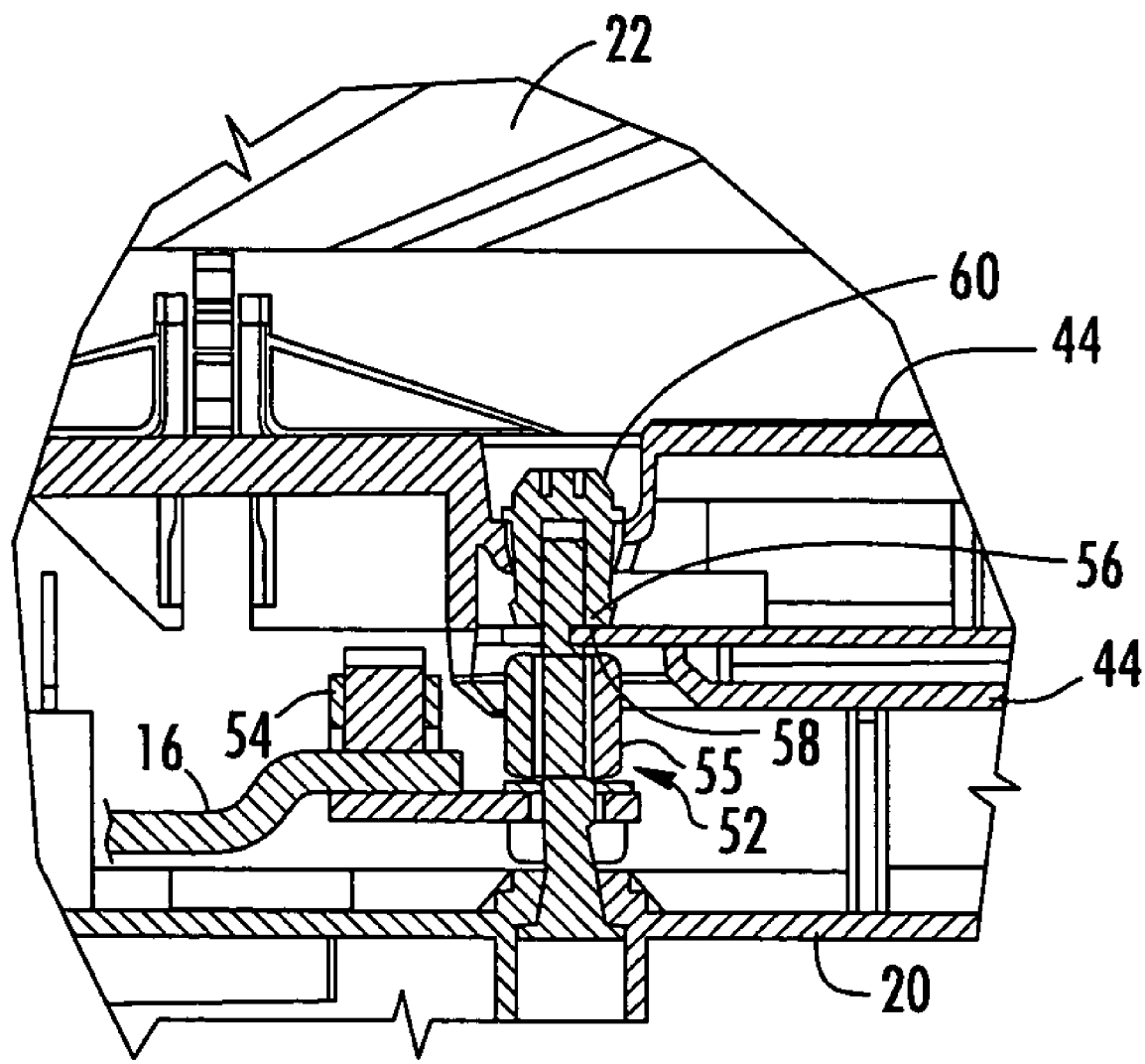
FIG. 3 is an enlarged cross-sectional view of a central portion of the enclosure of FIG. 1 with the inner and outer covers closed, showing the attachment of a service provider security nut to a grounding post to thereby fix and ground active electronic components within the enclosure.

As shown in FIG. 2, when housing/inner cover 44 is in the closed position, grounding post 52 extends through aperture 53 in PCB 42 and an electrically conductive ground connection portion 56 of PCB 42 contacts grounding post shoulder 58. Shoulder 58 is illustrated as a slot in post 52, but could be any other shape, or a portion of threaded nut 55, if so desired. Also, a service provider security nut 60 is attachable to grounding post 52, for example by cooperative threads (see FIG. 3). When service provider security nut 60 is attached as shown in FIG. 2 and FIG. 3, active electronic components 40 are fixed within the interior volume 26 of the housing 18 and are grounded via grounding post 52 and the ground cable 16. Further, when in the closed position of FIG. 2, housing/inner cover 44 provides secure protection for a service provider portion 62 of the housing interior volume 26, thereby providing a service provider compartment between the housing/inner cover 44 and base 20.

Therefore, in contrast to conventional NID designs, the act of attaching the service provider security nut 60 not only secures the provider compartment 62 but also in the same step grounds the active electrical components 40. Such structure and functionality beneficially not only reduces steps and materials needed, but also prevents a factory installer or field technician from accidentally overlooking the connecting or reconnecting of active electronic components 40 to earth ground. Thus, the attaching of the security nut 60 to protect service provider equipment from improper access also serves as an automatic safety feature by simultaneously and simply making a ground connection.

As shown in FIG. 2, when outer cover 22 is in the opened position and housing/inner cover 44 is in the closed position, various subscriber connection equipment 64 is accessible by the subscriber. Such subscriber connection equipment 64 may include one or more of twisted wire pair terminations (such as screw terminals 66 or RJ-type voice 68 or data 70 connections), coaxial terminations 72, and/or fiber optic terminations 74. Other termination types may be employed as well, such as biased spring terminals, etc. Multiple terminations of each type may be provided as desired so as to provide a flexible enclosure 10 useful in different applications. Also, other optional items (not shown) such as splitters, splice kits, pigtails, etc. may be provided by the subscriber to meet the individual needs of the subscriber premises. If so desired, a conventional subscriber bridge or line module (not shown) could be included. If so, the various subscriber terminations could be located on a portion of the subscriber bridge available to the subscriber when the housing/inner cover 44 is closed, and additional jacks could be provided in the subscriber bridge as a point of demarcation between a service provider line and a subscriber line for testing connections directly to the service provider equipment. Such jacks and terminations are essentially incorporated into housing/inner cover 44 in the embodiment of FIGS. 1-4. Also, other termination types could be employed, such as insulation displacement connectors (IDC connectors), if desired. It should be understood therefore that any sort of enclosure 10 providing subscriber connection equipment 64 that is available when active electrical components 40 are connected and grounded as disclosed herein are included within the intended scope of the invention.

According to certain other aspects of the invention, enclosure 10 may incorporate a skirt 76 extending in a first direction 78 along a lower edge of outer cover 22. Skirt 76 is provided to allow for a more aesthetic, continuous edge of enclosure 10. Therefore, substantially continuous edge 80 of skirt 76 extends in the first direction 78 at least as far as cable ports 34 and bottom mounting foot 36. By covering cable ports 34 and mounting foot 36, these elements are more protected from unintentional or unwanted contact, and improve the aesthetics of the outer cover 22 and enclosure 10 in general. As shown in FIG. 4, hinges 24 are arranged so as to be not visible from the front side of enclosure 10, and an opening 82 for a subscriber padlock is also located within the substantially continuous perimeter of outer cover 22, thereby providing a further continuous and aesthetically pleasing housing 18.

It should be understood that the benefits of covering the cable ports, hinges, mounting feet, etc. by using the configuration of the enclosure 10 may be achieved separate from or in conjunction with the benefits of the grounding of the active electronic components 40 via the grounding post 52 and the service provider security nut 60 described above. Thus, the advantages of each of these concepts may be employed separately or together, as desired in a given application.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

That which is claimed is:

1. An enclosure for housing communications equipment at a subscriber premises, the enclosure receiving at least one service provider cable, at least one subscriber cable, and at least one ground cable, the enclosure comprising: a housing having a base and an outer cover movably attached to the base, the outer cover being movable between an opened position and a closed position, the outer cover and the base defining a housing interior volume when the outer cover is in the closed position; the base defining at least one cable port for receiving the service provider cable, the subscriber cable, and the ground cable; a grounding post extending from the base within the housing interior volume, the ground cable being electrically connectable with the grounding post; active electronic components located within the housing interior volume, the active electronic components connecting the service provider cable with the subscriber cable; and a service provider security nut attachable to the grounding post, wherein when the service provider security nut is attached to the grounding post, the active electronic components are both fixed within the housing and grounded via the grounding post and the ground cable.

2. The enclosure of claim 1, further comprising an inner cover movably attached to the base via a hinge and movable between an opened position and a closed position, the active electronic components being mounted to the inner cover.

3. The enclosure of claim 2, wherein the service provider security nut secures the inner cover in the closed position.

4. The enclosure of claim 3, further comprising service provider equipment and subscriber connection equipment located within the housing interior volume, and wherein when the outer cover is in the opened position and the inner cover is in the closed position with the service provider security nut attached to the grounding post, access to the service provider equipment is substantially prevented, while access to the subscriber connection equipment is permitted.

5. The enclosure of claim 4, wherein the subscriber connection equipment includes at least one of a twisted wire pair termination, a coaxial termination, and a fiber optic termination.

6. The enclosure of claim 4, wherein when the outer cover and the inner cover are in the opened position, access to the service provider equipment is permitted.

7. The enclosure of claim 1, wherein the active electronic components include a printed circuit board (PCB).

8. The enclosure of claim 7, wherein the grounding post extends through and electrically contacts the printed circuit board (PCB) when the active electronic components are fixed and grounded.

9. The enclosure of claim 1, further comprising a grounding lug attached to the grounding post, the ground cable being attachable to the grounding lug.

10. The enclosure of claim 1, wherein the service provider cable includes at least one of a twisted wire pair cable, a coaxial cable, a composite cable, and a fiber optic cable, and the subscriber cable includes at least one of a twisted wire pair cable, a coaxial cable, and a fiber optic cable.

11. The enclosure of claim 1, wherein the base includes a back wall and a perimeter wall extending outwardly from the back wall, the perimeter wall including an end wall which defines the at least one cable port extending therefrom in a first direction, the outer cover having a skirt defining a substantially continuous edge, the skirt extending in the first direction beyond the end wall at least as far as the at least one cable port when the outer cover is in the closed position.

12. The enclosure of claim 11, wherein the base includes a mounting foot adjacent the end wall for mounting the enclosure to a surface at the subscriber premises, the skirt extending in the first direction at least as far as the mounting foot when the outer cover is in the closed position.

13. An enclosure for housing communications equipment at a subscriber premises, the enclosure receiving at least one service provider cable, at least one subscriber cable, and at least one ground cable, the enclosure including: a housing having a base and an outer cover movably attached to the base, the outer cover being movable between an opened position and a closed position, the outer cover and the base defining a housing interior volume when the outer cover is in the closed position; the housing having an inner cover movably attached to the base, the inner cover being movable between an opened position and a closed position, the inner cover and the base defining a service provider compartment within the housing interior volume when the inner cover is in the closed position; the base defining at least one cable port for receiving the service provider cable, the subscriber cable, and the ground cable; a grounding post extending from the base within the service provider compartment, the ground cable being electrically connectable with the grounding post; and active electronic components within the service provider compartment, the active electronic components connecting the service provider cable with the subscriber cable; wherein the grounding post extends through an aperture in the active electronic components when the inner cover is in the closed position, and wherein the inner cover is fixed in the closed position to the grounding post to prevent access to the service provider compartment and to ground the active electronic components to the grounding post and the ground cable.

14. The enclosure of claim 13, wherein the inner cover and the active electronic components are removable from the housing when the inner cover is in the opened position.

15. The enclosure of claim 13, wherein the active electronic components include a printed circuit board (PCB) and wherein the grounding post extends through the printed circuit board (PCB) when the inner cover is in the closed position.

16. The enclosure of claim 13, further including a grounding lug attached to the grounding post, the ground cable being attachable to the grounding lug.

17. The enclosure of claim 13, wherein the service provider cable includes at least one of a twisted wire pair cable, a coaxial cable, a composite cable, and a fiber optic cable, and the subscriber cable includes at least one of a twisted wire pair cable, a coaxial cable, and a fiber optic cable.

18. The enclosure of claim 13, wherein the enclosure further includes subscriber connection equipment including at least one of a twisted wire pair termination, a coaxial termination, and a fiber optic termination, and wherein access to the subscriber connection equipment is permitted when the inner cover is in the closed position and the outer cover is in the opened position.

19. An enclosure for protecting communications equipment at a subscriber premises, the enclosure receiving at least one service provider cable and at least one subscriber cable, the enclosure including: a housing having a base, the base having a back wall, a mounting foot, and a perimeter wall extending outwardly from the back wall, the perimeter wall including an end wall defining a plurality of cable ports extending therefrom in a first direction; and an outer cover movably attached to the base, the outer cover being movable between a closed position and an opened position, the outer cover and the base defining a housing interior volume when the outer cover is in the closed position, connections between the service provider cable and the subscriber cable being made within the housing interior volume, the outer cover having a skirt defining a substantially continuous edge, the skirt extending in the first direction beyond the end wall at least as far as the cable ports and the mounting foot when the outer cover is in the closed position.

20. The enclosure of claim 19, wherein the outer cover is attached to the housing via a hinge, the hinge being disposed behind the outer cover when the outer cover is in the closed position.

21. The enclosure of claim 19, further including an inner cover attachable to the base via a hinge and movable between an opened position and a closed position, the inner cover and the base defining a service provider compartment within the housing interior volume when the inner cover is in the closed position.

* * * * *